United States Patent
Lo et al.

(10) Patent No.: US 11,804,374 B2
(45) Date of Patent: Oct. 31, 2023

(54) STRAIN RELIEF TRENCHES FOR EPITAXIAL GROWTH

(71) Applicant: Taiwan Semiconductor Manufacturing Company Limited, Hsinchu (TW)

(72) Inventors: Yi-Chuan Lo, Hsinchu (TW); Pravanshu Mohanta, Hsinchu (TW); Jiang-He Xie, Hsinchu (TW); Ching Yu Chen, Zhubei (TW); Ming-Tsung Chen, New Taipei (TW); Chia-Ling Yeh, Jhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 120 days.

(21) Appl. No.: 16/949,373

(22) Filed: Oct. 27, 2020

(65) Prior Publication Data

US 2022/0130670 A1    Apr. 28, 2022

(51) Int. Cl.
*H01L 21/00* (2006.01)
*H01L 21/02* (2006.01)
(Continued)

(52) U.S. Cl.
CPC .... *H01L 21/02656* (2013.01); *H01L 21/0254* (2013.01); *H01L 21/0262* (2013.01);
(Continued)

(58) Field of Classification Search
CPC ........... H01L 21/0254; H01L 21/02381; H01L 21/02587; H01L 21/308
See application file for complete search history.

(56) References Cited

U.S. PATENT DOCUMENTS

| 7,811,907 B2 | 10/2010 | Shibata et al. |
| 10,964,799 B2 | 3/2021 | Xu |

(Continued)

FOREIGN PATENT DOCUMENTS

| DE | 102007013167 A1 | 11/2007 | |
| EP | 2700093 A1 * | 2/2014 | ........... B81B 3/0086 |

(Continued)

OTHER PUBLICATIONS

Taiwanese Office Action issued in Application No. 11021270740; dated Dec. 28, 2021, 5 Pages.

*Primary Examiner* — Reema Patel
(74) *Attorney, Agent, or Firm* — Harrity & Harrity, LLP

(57) ABSTRACT

Strain relief trenches may be formed in a substrate prior to growth of an epitaxial layer on the substrate. The trenches may reduce the stresses and strains on the epitaxial layer that occur during the epitaxial growth process due to differences in material properties (e.g., lattice mismatches, differences in thermal expansion coefficients, and/or the like) between the epitaxial layer material and the substrate material. The stress and strain relief provided by the trenches may reduce or eliminate cracks and/or other types of defects in the epitaxial layer and the substrate, may reduce and/or eliminate bowing and warping of the substrate, may reduce breakage of the substrate, and/or the like. This may increase the center-to-edge quality of the epitaxial layer, may permit epitaxial layers to be grown on larger substrates, and/or the like.

20 Claims, 15 Drawing Sheets

(51) Int. Cl.
*H01L 29/06* (2006.01)
*H01L 29/20* (2006.01)
*H01L 21/308* (2006.01)

(52) U.S. Cl.
CPC .. *H01L 21/02381* (2013.01); *H01L 21/02587* (2013.01); *H01L 21/308* (2013.01); *H01L 29/0657* (2013.01); *H01L 29/2003* (2013.01)

(56) References Cited

U.S. PATENT DOCUMENTS

| | | |
|---|---|---|
| 2004/0185665 A1 | 9/2004 | Kishimoto et al. |
| 2005/0263850 A1* | 12/2005 | Aitken .................. H01L 27/101 257/E27.071 |
| 2008/0070413 A1 | 3/2008 | Chen et al. |
| 2011/0049568 A1 | 3/2011 | Lochtefeld et al. |
| 2013/0137243 A1 | 5/2013 | Yang et al. |
| 2013/0313567 A1 | 11/2013 | Furuya et al. |
| 2014/0015003 A1* | 1/2014 | Koo .................... H01L 29/7813 438/138 |
| 2017/0365702 A1 | 12/2017 | Prechtl et al. |
| 2018/0026096 A1* | 1/2018 | Jacob ................ H01L 21/02381 257/622 |
| 2018/0211837 A1* | 7/2018 | Liang ................ H01L 21/02499 |

FOREIGN PATENT DOCUMENTS

| | | | | |
|---|---|---|---|---|
| JP | H10284588 | * | 10/1998 | ............. H01L 21/76 |
| KR | 20070036714 A | | 4/2007 | |
| KR | 20140110704 A | | 9/2014 | |
| WO | WO-2018004607 A1 | * | 1/2018 | ......... H01L 27/1207 |

* cited by examiner

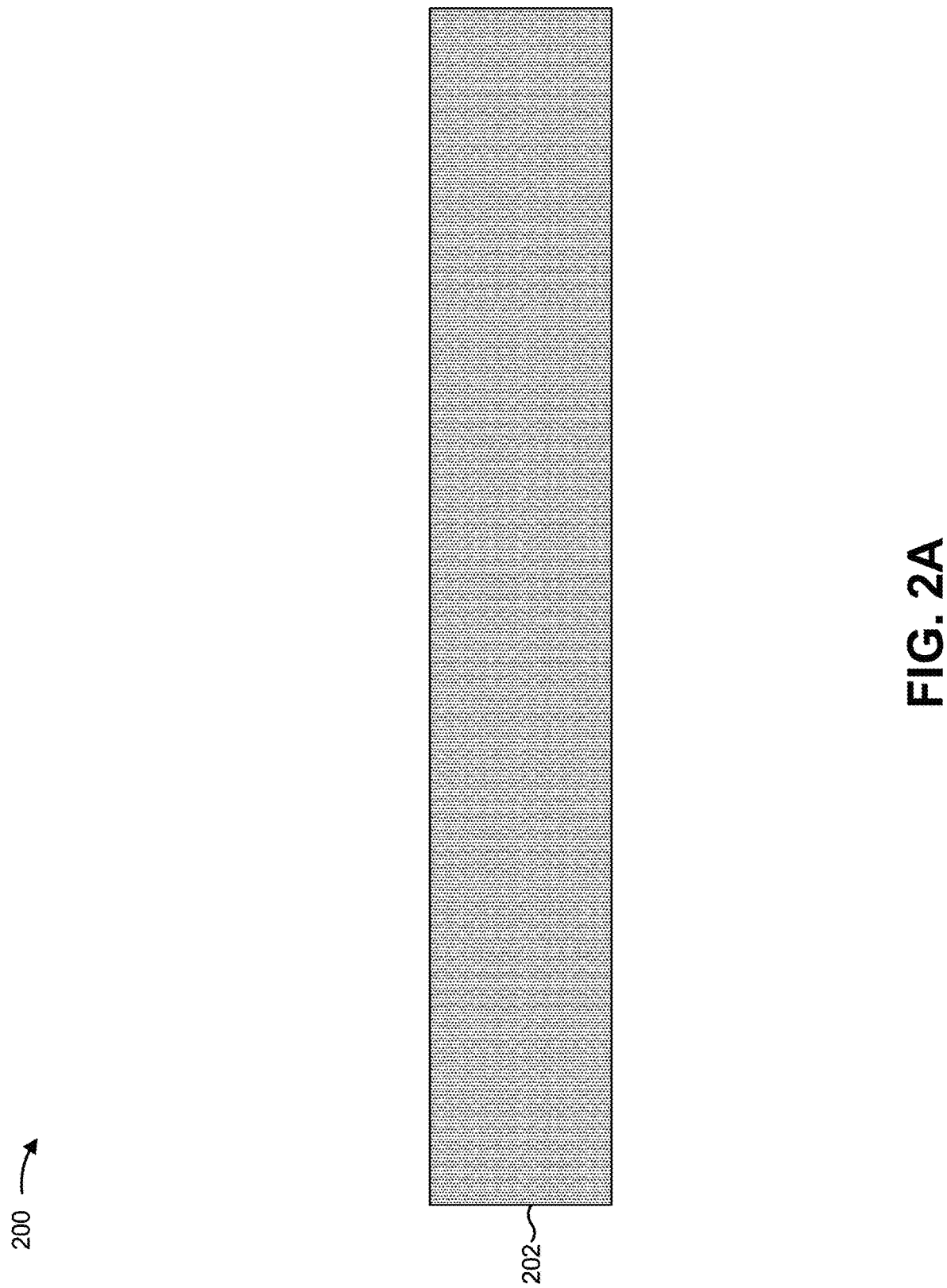

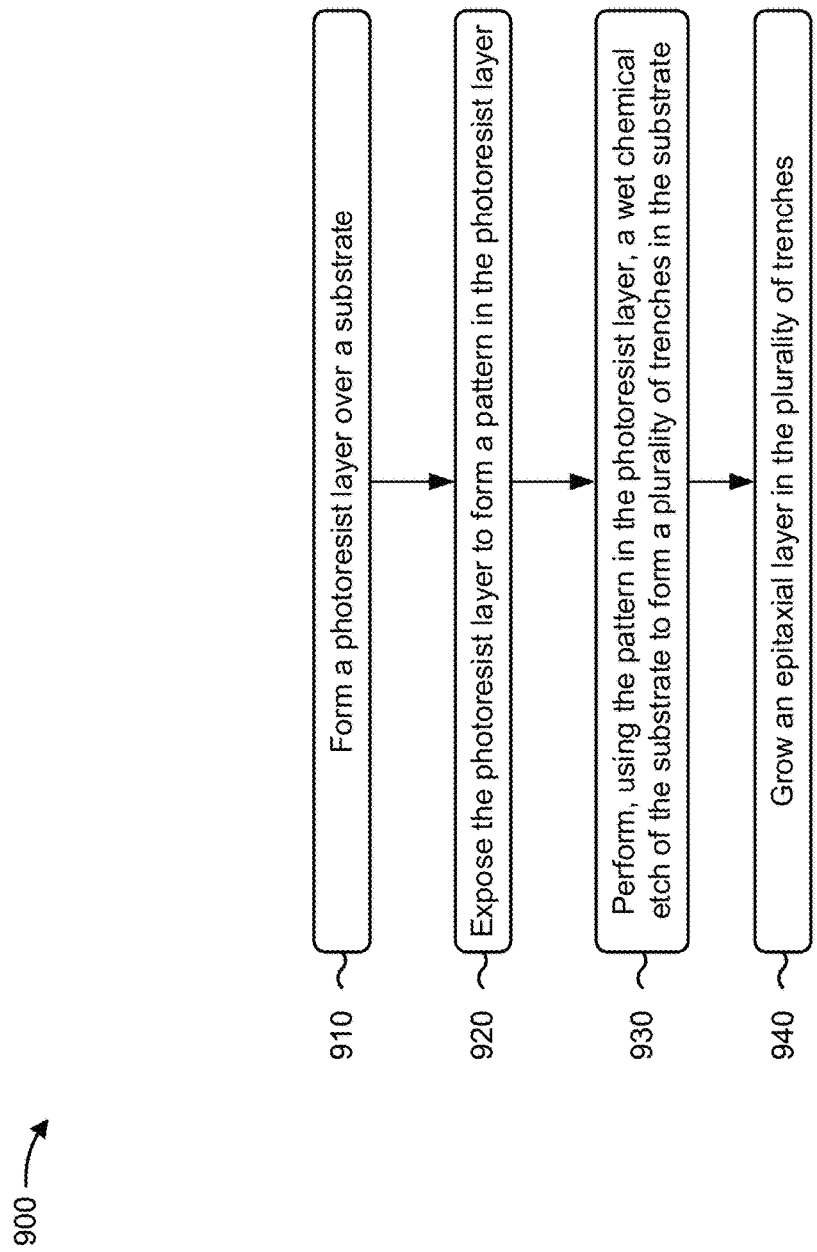

STRAIN RELIEF TRENCHES FOR EPITAXIAL GROWTH

BACKGROUND

Gallium nitride (GaN)-based materials have several advantages on electrical, mechanical, and chemical properties, such as wide band gap, high breakdown voltage, high electron mobility, large elastic modulus, high piezoelectric and piezoresistive coefficients, etc., as well as chemical inertness. Such advantages make GaN-based materials attractive for making devices such as high electron mobility transistors (HEMTs), high brightness light-emitting diodes (LEDs), and other types of electronic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2G are diagrams of one or more example implementations described herein.

FIGS. 8 and 9 are flowcharts of example processes for epitaxial growth.

DETAILED DESCRIPTION

Figure 1:
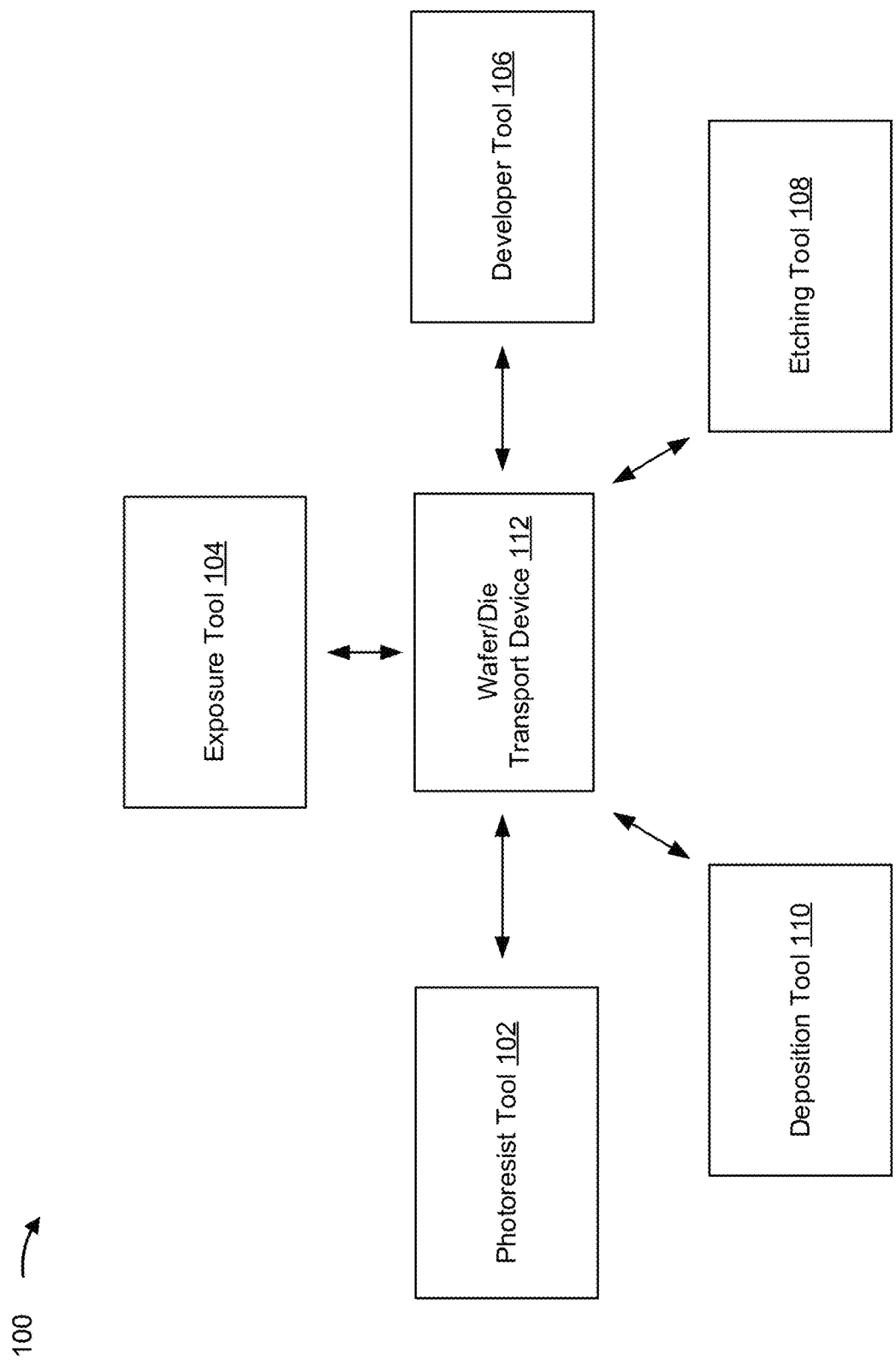
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Gallium nitride (GaN) can be grown through epitaxial growth on various types of substrates, such as silicon (Si), silicon carbide (SiC), or sapphire ($Al_2O_3$). However, due to the large lattice mismatch between GaN and silicon (the lattice constant of silicon is around 17% larger than the lattice constant of GaN) and the thermal expansion coefficient (TEC) mismatch between GaN and silicon (3.59 for silicon compared with 5.45 for GaN), stresses from these material differences can lead to GaN epitaxial layer cracks, wafer warping or bowing, and/or wafer breakage. These issues can occur, for example, after GaN growth at high processing temperatures of 1000 degrees Celsius or greater, where high tensile stresses are induced in the GaN epitaxial growth layer as the GaN epitaxial growth layer and the substrate cool to room temperature. In a GaN on Si high electron mobility transistor (HEMT) structure, the use of a grading buffer (e.g., aluminum GaN (AlGaN), where the Al composition is gradually reduced) and super lattice structures (e.g., aluminum nitride (AlN)/GaN super lattice structures) may control cracking, wafer warping, and/or bowing in some cases. However, these techniques sometime suffer degraded epitaxial quality or may limit the epitaxial structure to larger thicknesses and/or to larger diameter substrates.

In some implementations described herein, strain relief trenches may be formed in a substrate prior to growth of an epitaxial layer on a substrate. The trenches may reduce the stresses and strains on the epitaxial layer that occur during the epitaxial growth process due to differences in material properties (e.g., lattice mismatches, differences in TEC, and/or the like) between the epitaxial layer material and the substrate material. The stress and strain relief provided by the trenches may reduce or eliminate cracks and/or other types of defects in the epitaxial layer and the substrate, may reduce and/or eliminate bowing and warping of the substrate, may reduce breakage of the substrate, and/or the like. This may increase the center-to-edge quality of the epitaxial layer, may permit epitaxial layers to be grown on larger substrates (e.g., 200-300 millimeter (mm) wafers and larger), and/or the like.

FIG. 1 is a diagram of an example environment 100 in which systems and/or methods described herein may be implemented. As shown in FIG. 1, the environment 100 may include a photoresist tool 102, an exposure tool 104, a developer tool 106, an etching tool 108, a deposition tool 110, and a wafer/die transport device 112. The tools and/or devices included in the example environment 100 may be included in a semiconductor clean room, a semiconductor foundry, a semiconductor processing and/or manufacturing facility, and/or the like. In some implementations, the example environment 100 includes fewer or greater quantity of tools, differently arranged tools, and/or the like.

The photoresist tool 102 includes one or more devices capable of forming various types of layers on a substrate by a spin coating process or another type of coating process. For example, the photoresist tool 102 may form a photoresist layer (e.g., a spin-on photoresist layer and/or the like) on a substrate, as described herein. A photoresist layer may include a layer of radiation sensitive material capable of being patterned via exposure to a radiation source, such as an ultraviolet light (UV) source (e.g., a deep UV light source, an extreme UV light source, and/or the like), an x-ray source, and/or the like.

The exposure tool 104 includes one or more devices capable of exposing a photoresist layer to a radiation source, such as a UV source (e.g., a deep UV light source, an extreme UV light source, and/or the like), an x-ray source, and/or the like. The exposure tool 104 may expose the photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device or substrate, and/or the like. In some implementations, an exposure device includes a scanner, a stepper, or a similar type of exposure device.

The developer tool 106 includes one or more devices capable of developing a photoresist layer that has been exposed to a radiation source to develop a pattern transferred to the photoresist layer from the exposure tool 104 (e.g., a stepper, a scanner, or another type of exposure device). In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etching tool 108 includes one or more devices capable of etching various types of materials of a wafer or semiconductor device. For example, an etching device may include a wet etching device, a dry etching device, and/or the like. In some implementations, the etching tool 108 is capable of etching trenches or other types of structures in a substrate, as described herein. In these cases, the etching tool 108 uses various chemicals and techniques to remove portions of the substrate The deposition tool 110 includes one or more devices capable of depositing various types of materials onto a substrate. For example, the deposition tool 110 may include a chemical vapor deposition tool (e.g., a molecular beam epitaxy (MBE) tool, a metalorganic vapor-phase epitaxy (MOCVD) tool, and/or another type of chemical vapor deposition tool), a physical vapor deposition tool (e.g., a sputtering device and/or another type of physical vapor deposition tool), and/or the like. In some implementations, the deposition tool 110 may form or deposit various types of layers for epitaxial growth on a substrate, as described herein, such as buffer layers, spacer layers, channel layers, barrier layers, and/or the like.

The wafer/die transport device 112 includes a mobile robot, a robot arm, a tram or rail car, and/or another type of device that are used to transport wafers and/or dies between semiconductor processing tools 102-110 and/or to and from other locations, such as a wafer rack, a storage room, and/or the like. In some implementations, the wafer/die transport device 112 may be a programmed device to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

FIGS. 2A-2G are diagrams of one or more example implementations described herein. As shown in FIGS. 2A-2G, the example implementations may include a wafer 200, which may include a semiconductor wafer, a semiconductor device, and/or the like. In some implementations, the diameter of the wafer 200 is in a range of about 150 mm to about 300 mm. In some implementations, the diameter of wafer 200 is smaller than 150 mm or greater than 300 mm.

As shown in FIG. 2A, the wafer 200 may include a substrate 202 in and/or on which an epitaxial layer is to be grown. The substrate 202 may be formed of silicon (Si), silicon carbide (SiC), sapphire (e.g., an aluminum oxide such as $Al_2O_3$), or another semiconductor material. In some implementations, the thickness of the substrate 202 is in a range of about 675 microns (µm) to about 1000 µm. In some implementations, the thickness of the substrate 202 is smaller than 675 µm or greater than 1000 µm.

Figure 2B:
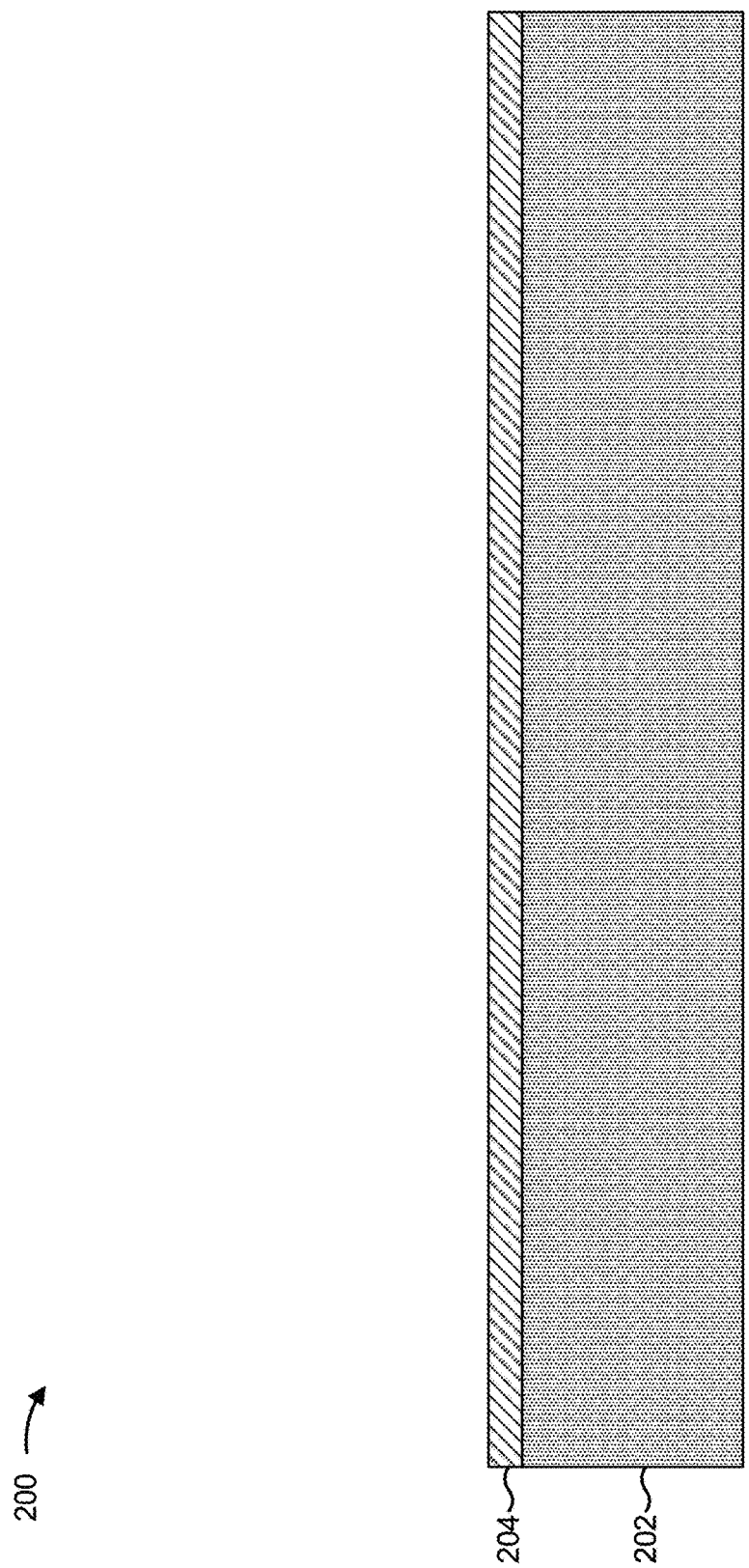
Figure 2C:
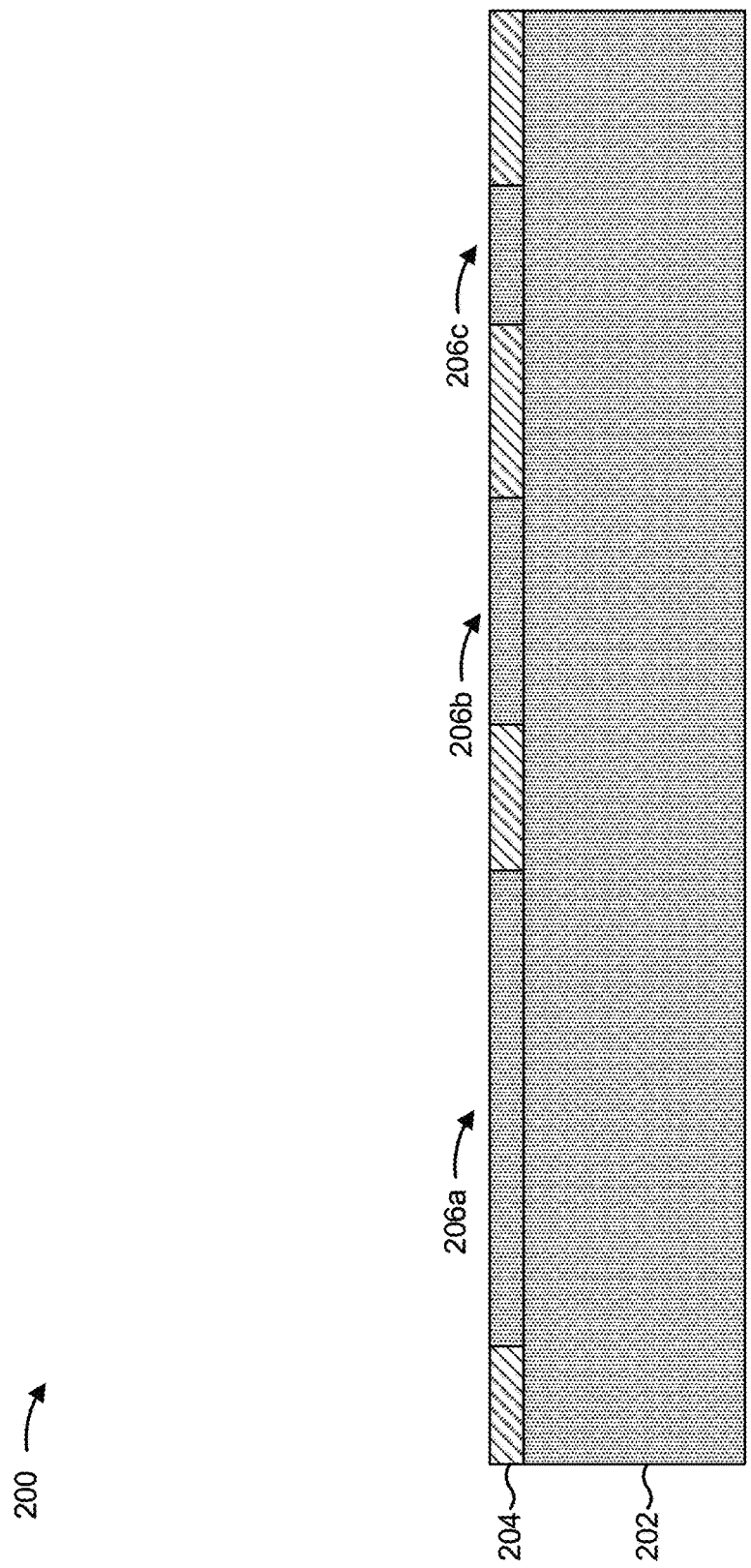

As shown in FIG. 2B, a semiconductor processing tool (e.g., the photoresist tool 102) may form a photoresist layer 204 on the substrate 202. For example, the semiconductor processing tool may form the photoresist layer 204 on the substrate 202 by a spin coating process or another type of coating process. As shown in FIG. 2C, a semiconductor processing tool (e.g., the exposure tool 104) may expose the photoresist layer 204 to a radiation source to transfer a pattern from a photomask to the photoresist layer 204. In these cases, the semiconductor processing tool may expose (or may refrain from exposing, depending on the type of photoresist and exposure process) portions 206 (e.g., portion 206a, portion 206b, portion 206c, and/or other portions) of the photoresist layer 204 in areas where strain relief trenches are to be formed in the substrate 202.

Figure 2D:
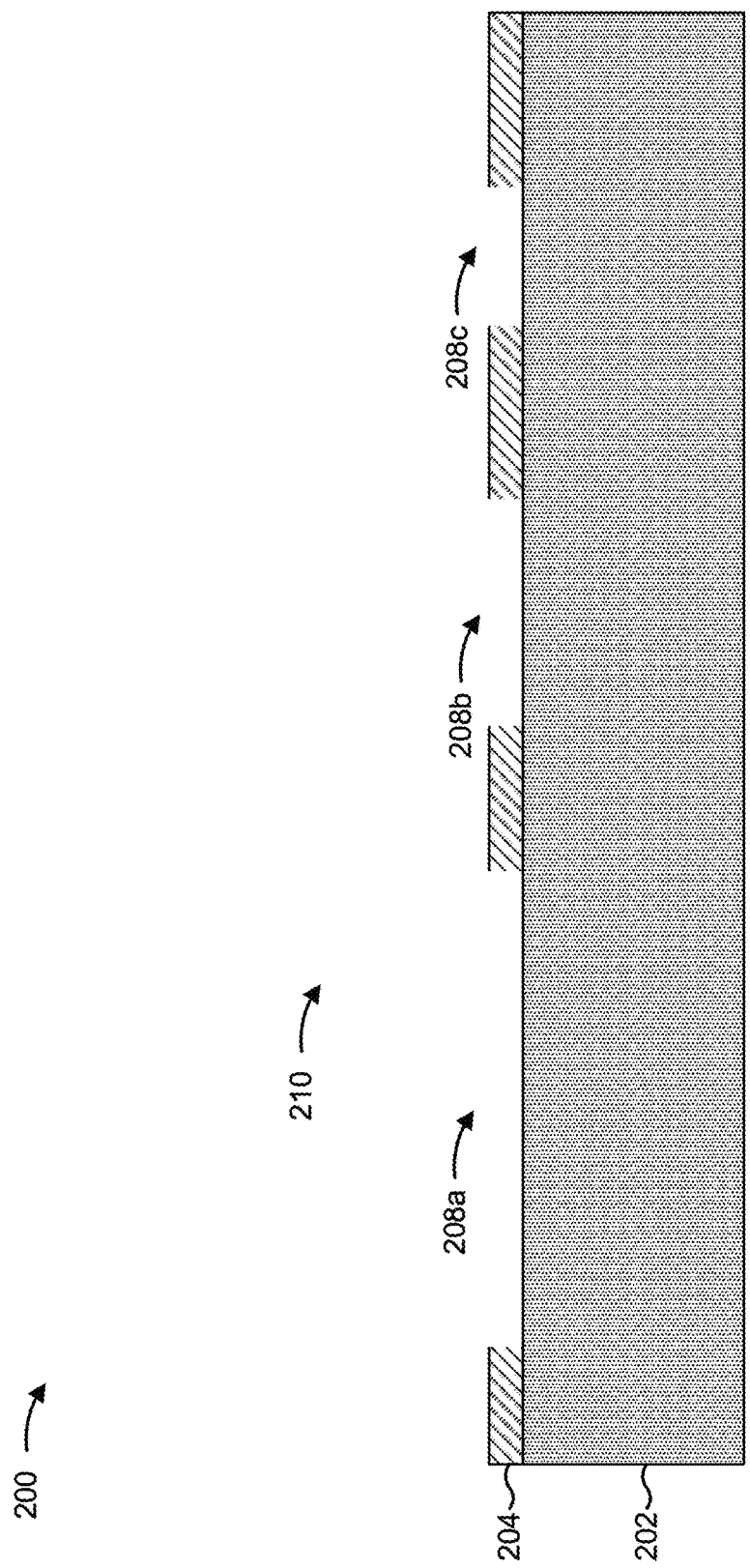

As shown in FIG. 2D, a semiconductor processing tool (e.g., the developer tool 106) may develop the photoresist layer 204 by removing the exposed (or unexposed) portions 206 from the substrate 202. In some implementations, the semiconductor processing tool develops the photoresist layer 204 by dissolving the exposed or unexposed portions 206 of the photoresist layer 204 through the use of a chemical developer. With the portions 206 removed, openings 208 (e.g., opening 208a, opening 208b, opening 208c, and/or the like) are formed through the photoresist layer 204. The openings 208 through the photoresist layer 204 form a pattern 210 for forming strain relief trenches in the substrate 202.

Figure 2E:
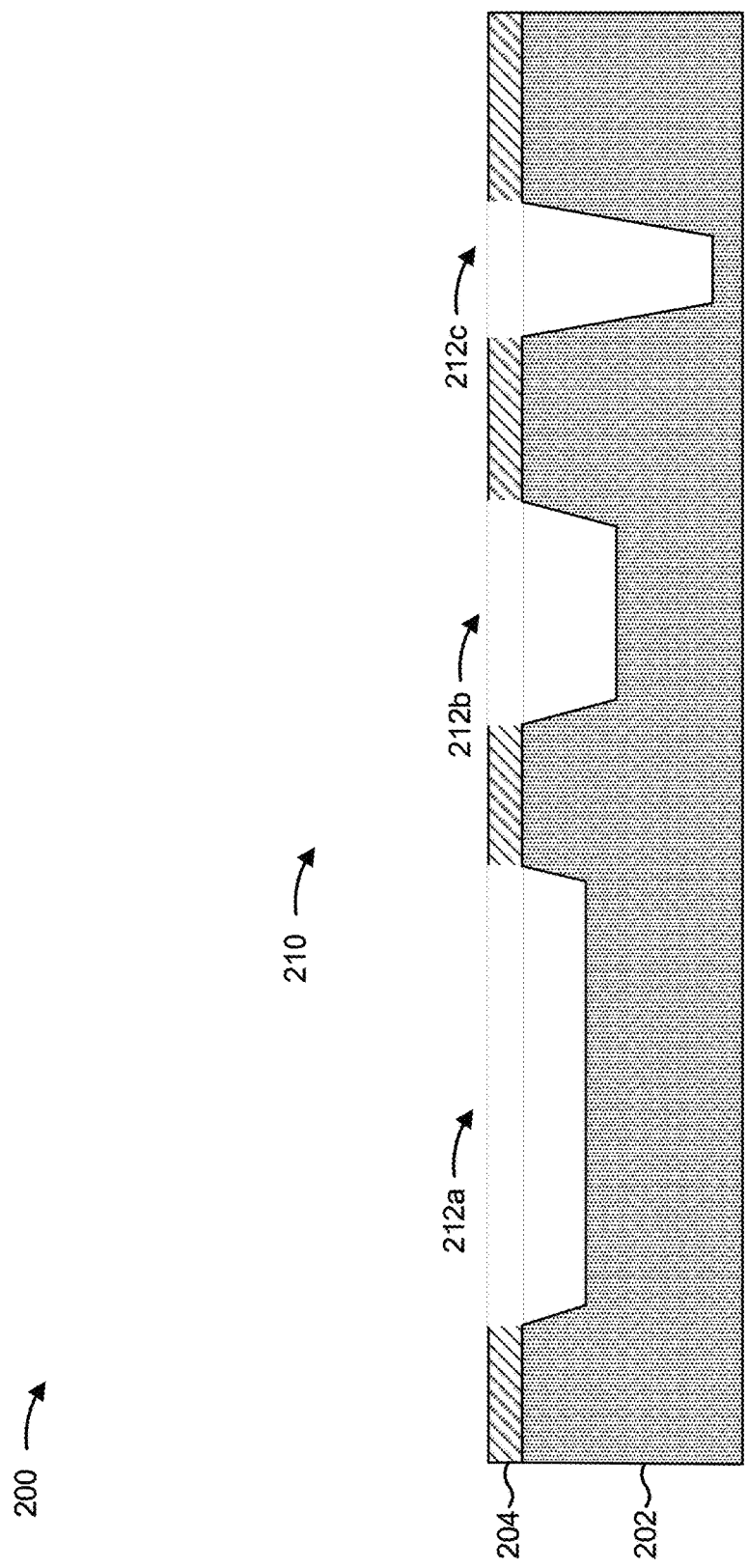

As shown in FIG. 2E, a semiconductor processing tool (e.g., the etching tool 108) may etch the substrate 202 using the pattern 210 formed in the photoresist layer 204. For example, the semiconductor processing tool may perform a wet etching technique, a dry etching technique, or another type of etching technique to remove portions of the substrate 202 where openings 208 were formed in the photoresist layer 204. Removing the portions of the substrate 202 forms one or more strain relief trenches 212 in the substrate 202. For example, removing the portions of the substrate 202 may form trench 212a, trench 212b, trench 212c, and/or the like. In some implementations, a greater quantity of strain relief trenches 212 may be formed in the substrate 202. In some implementations, fewer strain relief trenches 212 may be formed in the substrate 202. In some implementations, a single strain relief trench 212 may be formed in the substrate 202.

Figure 2F:
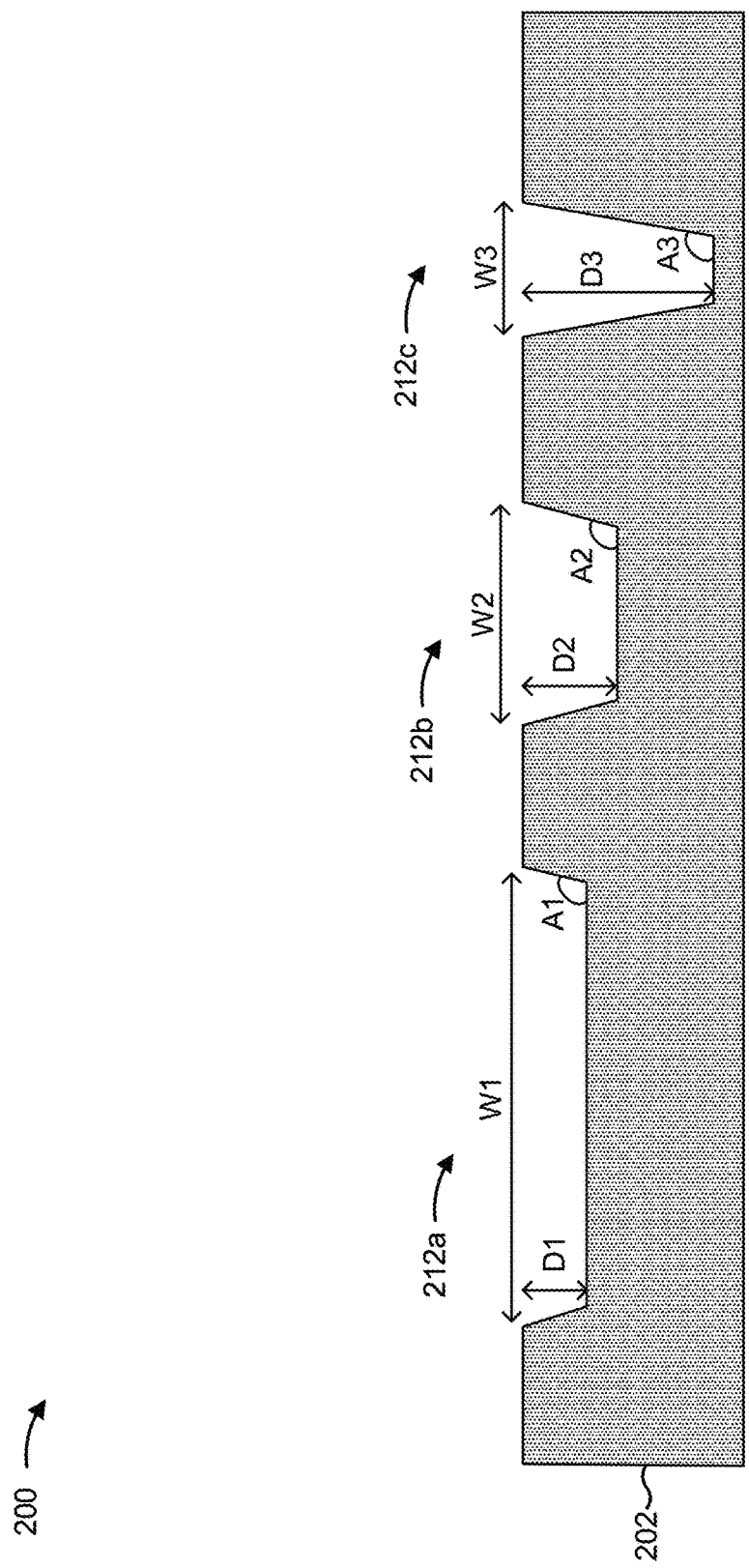

As shown in FIG. 2F, the remaining portions of the photoresist layer 204 may be removed from the substrate 202. As further shown in FIG. 2F, each strain relief trench 212 may have one or more properties or parameters, such as a width (W) and a depth (D). The width and the depth of a strain relief trench 212 may define (or may be defined by) an aspect ratio for the strain relief trench 212. As an example, trench 212a may have an example width (W1) and an example depth (D1) such that trench 212a has a width-to-depth aspect ratio in a range of approximately 3 to approximately 6. As another example, trench 212a may have an example width (W2) and an example depth (D2) such that trench 212b has a width-to-depth aspect ratio in a range of approximately 1 to approximately 3. As another example, trench 212c may have an example width (W3) and an example depth (D3) such that trench 212c has a width-to-depth aspect ratio in a range of approximately 0.1 to approximately 0.8.

The aspect ratio (and thus, the width and the depth) of a strain relief trench 212 may be controlled by the pattern 210 in the photoresist mask 204 (e.g., by the size of the opening 208 formed through the photoresist layer 204) and the etching process that is used to remove a portion of the substrate 202 to form the strain relief trench 212. In particular, the size of the opening 208 may control the width of the strain relief trench 212, and the etching chemical (e.g., hydrogen fluoride (HF) or another etching chemical) and etching time duration may be used to control the depth of the strain relief trench 212.

As further shown in FIG. 2F, the strain relief trenches 212 may have tapered walls. In these examples, the one or more properties and/or parameters may include a wall angle (A). For example, trench 212a may have a tapered wall angle (A1), trench 212b may have a tapered wall angle (A2), and trench 212c may have a tapered wall angle (A3). In some implementations, the wall angles for each trench 212 may be the same angle. In some implementations, two or more trenches 212 may have different wall angles. An example wall angle range may include approximately 10 degrees to approximately 15 degrees past 90 degrees.

In some implementations, other properties and/or parameters of a strain relief trench 212 may be controlled by the pattern 210 and the etching process, such as the shape of the strain relief trench 212 (both in a horizontal plane (or top-down view) and a vertical plane (or cross-sectional view)), a length of the strain relief trench 212, and/or the like. Moreover, the quantity of strain relief trenches 212 formed in the substrate 202, the spacing (or distance) between strain relief trenches 212, the shape of the strain relief trenches 212 (e.g., whether a strain relief trench 212 is a curved line trench, a straight line trench, or another shape of trench), the direction of a strain relief trench 212 relative to other strain relief trenches 212 (e.g., whether a strain relief trench 212 runs parallel to another strain relief trench 212, whether a strain relief trench 212 intersects another strain relief trench 212, whether a strain relief trench 212 runs perpendicular to another strain relief trench 212, and/or the like), and/or the like may be controlled by the pattern 210 and the etching process.

In some implementations, all or a subset of the strain relief trenches 212 may have one or more of the same properties and/or parameters, such as the same width, the same depth, the same length, the same spacing from other strain relief trenches 212, the same shape (e.g., the same horizontal plane (or top-down) shape, the same vertical plane (or cross-sectional) shape, and/or the like), and/or the like. In some implementations, all or a subset of the strain relief trenches 212 may have one or more different properties and/or parameters, such as different widths, different depths, different lengths, different spacings from other strain relief trenches 212, different shapes (e.g., different horizontal plane (or top-down) shapes, different vertical plane (or cross-sectional) shapes, and/or the like), and/or the like. In some implementations, all or a subset of the strain relief trenches 212 may be contiguous and/or may intersect with another strain relief trench 212. In some implementations, all or a subset of the strain relief trenches 212 may be non-contiguous or isolated from other strain relief trenches 212.

In some implementations, the pattern of the strain relief trenches 212 formed in the substrate 202, the quantity of the strain relief trenches 212, the morphology (e.g., the sizes and the shapes) of the strain relief trenches 212, the spacing between strain relief trenches 212, and/or other properties and/or parameters of the strain relief trenches 212 may be determined based on one or more parameters. The one or more parameters may include, for example, the diameter of the wafer 200 or the substrate 202, the thickness of the substrate 202, the thickness of the epitaxial layer to be grown on the substrate 202, the material type of the substrate 202, the material type of the epitaxial layer to be grown, the type of semiconductor device(s) to be formed using the epitaxial layer and/or the substrate 202, a target growth direction for the epitaxial layer, expected strains and stresses on the substrate 202 and/or the epitaxial layer during the epitaxial growth process, other parameters, and/or various combinations thereof.

Figure 2G:
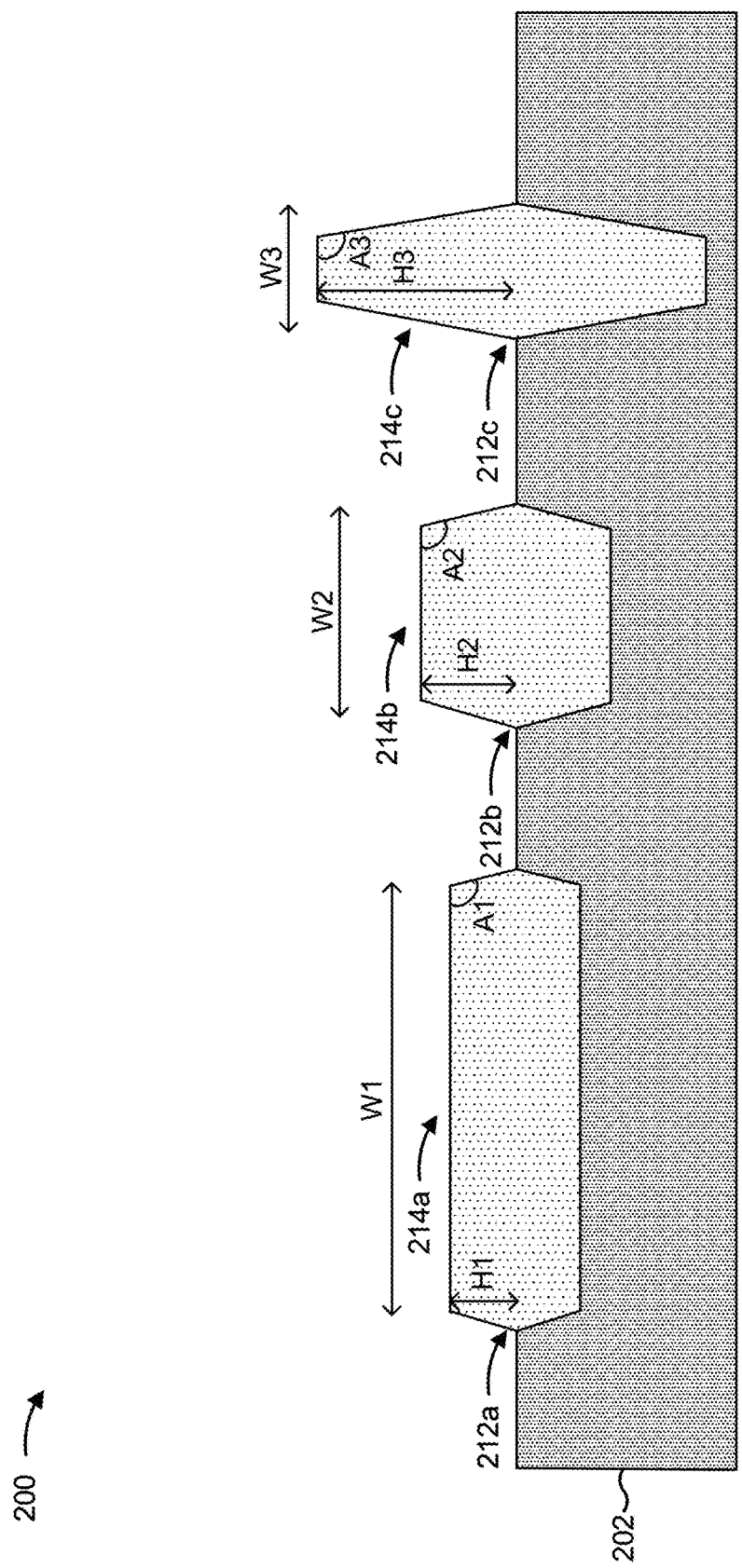

As shown in FIG. 2G, a semiconductor processing tool (e.g., deposition tool 110) my form an epitaxial layer 214 in and/or on the substrate 202. In particular, the semiconductor processing tool may form the epitaxial layer 214 in the strain relief trenches 212. In some implementations, the epitaxial layer 214 includes one or more regions or portions (e.g., portion 214a, portion 214b, portion 214c, and/or the like), where each portion is grown in a respective strain relief trench 212 (e.g., portion 214a may be grown in trench 212a, portion 214b may be grown in trench 212b, portion 214c may be grown in trench 212c, and/or the like). In some implementations, the portions of the epitaxial layer 214 are grown such that all or a subset of the portions of the epitaxial layer 214 are non-contiguous portions or isolated islands of epitaxial growth. Growing the epitaxial layer 214 such that the epitaxial layer 214 is discontinuous (e.g., such that the epitaxial layer 214 includes a plurality of portions) increases control of deformation (e.g., bowing, buckling, expansion, contraction, and/or the like) of the wafer 200 and isolates the stresses and strains on the epitaxial layer 214 caused by the deformation. In this way, the non-contiguous and/or isolated portions of the epitaxial layer 214 deform locally instead of transferring the stresses and strains of the deformation across the entire epitaxial layer 214, which may reduce and/or isolate cracking and/or breakage of the epitaxial layer 214 and/or the substrate 202.

In some implementations, various materials are used for the epitaxial layer 214, such as GaN, indium nitride (InN), aluminum nitride (AlN), another III-nitride (e.g., a nitride of a group III element), another III-V material, and/or the like. In some implementations, the semiconductor processing tool may form or grow the epitaxial layer 214 (and/or the portions thereof) using an MBE process, an MOCVD process, or another type of deposition process. In some implementations, the semiconductor processing tool forms or grows the epitaxial layer 214 such that the portions of the epitaxial layer 214 have the same properties and/or parameters. In some implementations, the semiconductor processing tool forms or grows the epitaxial layer 214 such that the portions of the epitaxial layer 214 have one or more different properties and/or parameters.

The properties and/or parameters for each portion of the epitaxial layer 214 may include a height (H) of the portion, a width (W) of the portion, a length of the portion, a shape of the portion, and/or another property and/or parameter. In some implementations, the height and the width of a portion of the epitaxial layer 214 may define (or may be defined by) an aspect ratio for the portion. As an example, epitaxial layer 214a may have an example width (W1) and an example height (H1) such that epitaxial layer 214a has a width-to-height aspect ratio in a range of approximately 3 to approximately 6. As another example, epitaxial layer 214a may have an example width (W2) and an example height (H2) such that epitaxial layer 214b has a width-to-height aspect ratio in a range of approximately 1 to approximately 3. As another example, epitaxial layer 214c may have an example width (W3) and an example height (H3) such that epitaxial layer 214c has a width-to-height aspect ratio in a range of approximately 0.1 to approximately 0.8.

In some implementations, a portion of the epitaxial layer 214 may be formed such that the height for the portion is greater than the width for the portion (e.g., such that the aspect ratio for the portion is greater than 1), as a portion may experience less vertical stress and strain as the width of the portion decreases. Similarly, the associated strain relief trench 212 may be formed such that the depth of the strain relief trench 212 is greater than the width for the strain relief trench 212.

As further shown in FIG. 2G, the portions of the epitaxial layers 214 may have tapered walls. In these examples, the one or more properties and/or parameters may include a wall angle (A). For example, epitaxial layer 214a may have a tapered wall angle (A1), epitaxial layer 214b may have a tapered wall angle (A2), and epitaxial layer 214c may have a tapered wall angle (A3). In some implementations, the wall angles for each portion of the epitaxial layer 214 may be the same angle. In some implementations, two or more portions of the epitaxial layer 214 may have different wall angles. An example wall angle range may include approximately 10 degrees to approximately 15 degrees past 90 degrees.

As indicated above, FIGS. 2A-2G are provided as one or more examples. Other examples may differ from what is described with regard to FIGS. 2A-2G. As an example, instead of using a photoresist layer to etch the substrate 202 to form the strain relief trenches 212, a hardmask may be used. The hardmask may be an oxide mask, such as silicon dioxide ($SiO_2$). A semiconductor processing tool (e.g., the deposition tool 110) may form the hardmask on the substrate 202 using a chemical vapor deposition process or a physical vapor deposition process (e.g., sputtering).

Figure 3B:
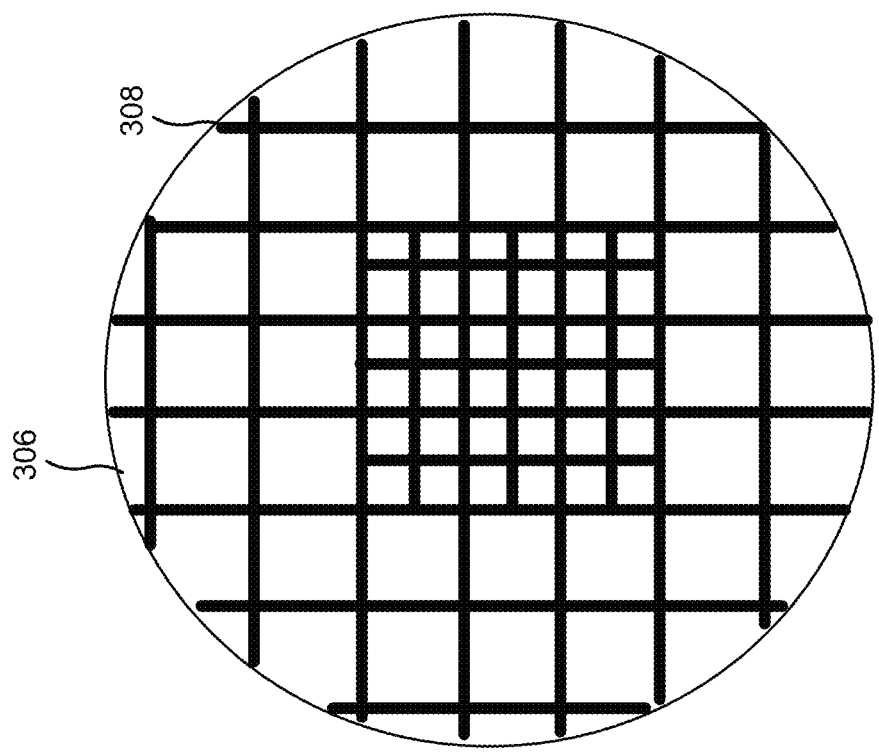
FIGS. 3A, 3B, and 4A-4E are diagrams of example strain relief trench configurations described herein.
Figure 3A:
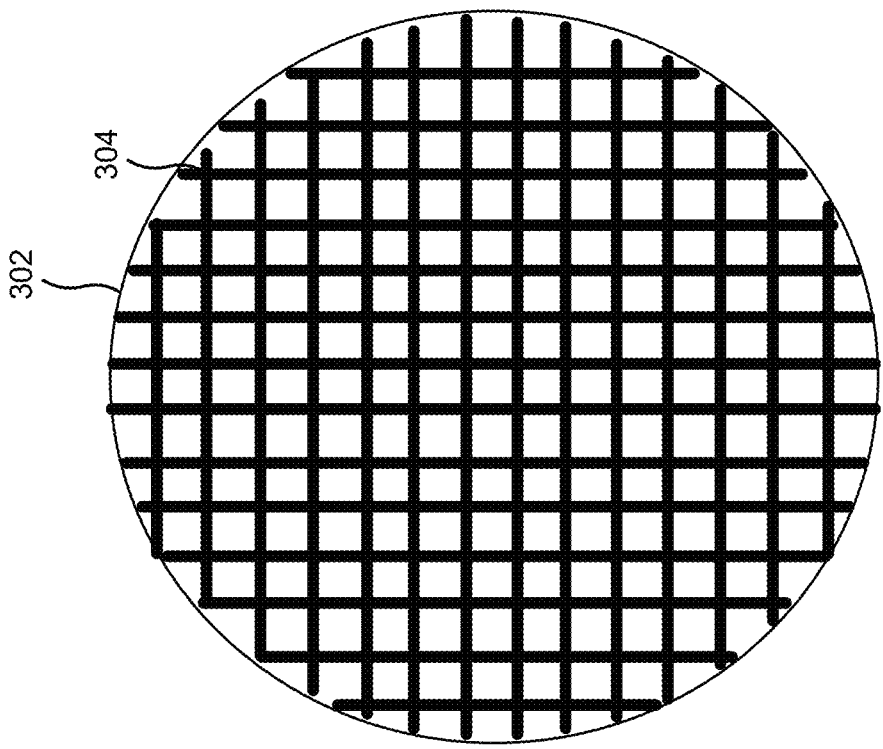

FIGS. 3A and 3B are diagrams of example strain relief trench configurations described herein. As shown in FIG. 3A, an example trench configuration 302 includes a grid pattern of perpendicular and intersecting trenches 304 (and associated epitaxial layer portions formed therein). As further shown in FIG. 3A, the spacing between parallel trenches 304 may be substantially the same. As shown in FIG. 3B, another example trench configuration 306 includes a grid pattern of perpendicular and intersecting trenches 308 (and associated epitaxial layer portions formed therein). As further shown in FIG. 3A, the spacing between subsets of the trenches 308 may be different. For example, some of the trenches 308 in the example trench configuration 306 are spaced more closely together than other trenches 308 in the example trench configuration.

As indicated above, FIGS. 3A and 3B are provided as one or more examples. Other example trench configurations may differ from what is described with regard to FIGS. 3A and 3B. For example, the any of the properties and/or parameters of strain relief trenches described above in connection with FIGS. 2A-2G (and/or the pattern of strain relief trenches), or a combination thereof, may be varied, configured, and/or adjusted for different trench configurations.

FIGS. 4A-4E are diagrams of example strain relief trench configurations described herein. In particular, FIGS. 4A-4E illustrate some examples for how different cross-sectional properties and/or parameters for strain relief trenches in a substrate may be varied or configured.

Figure 4A:
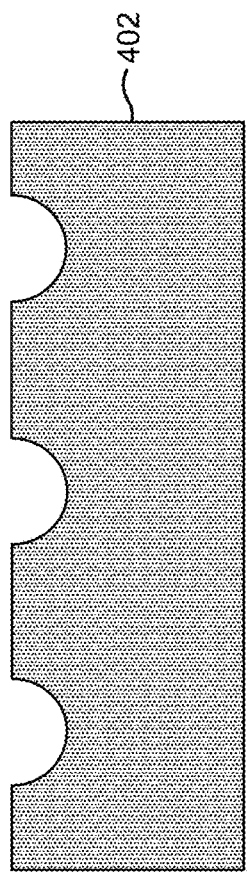
Figure 4D:
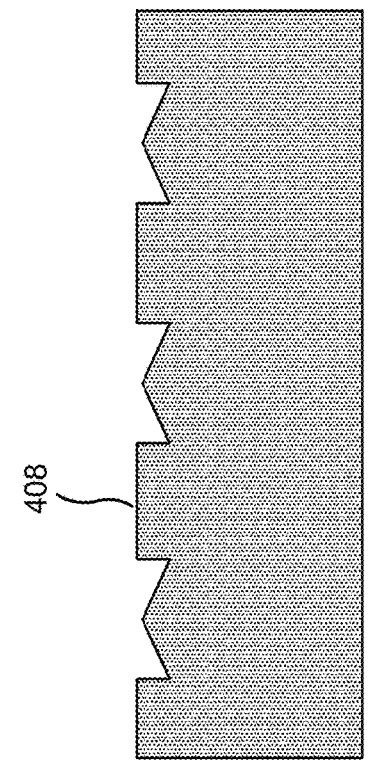
Figure 4E:
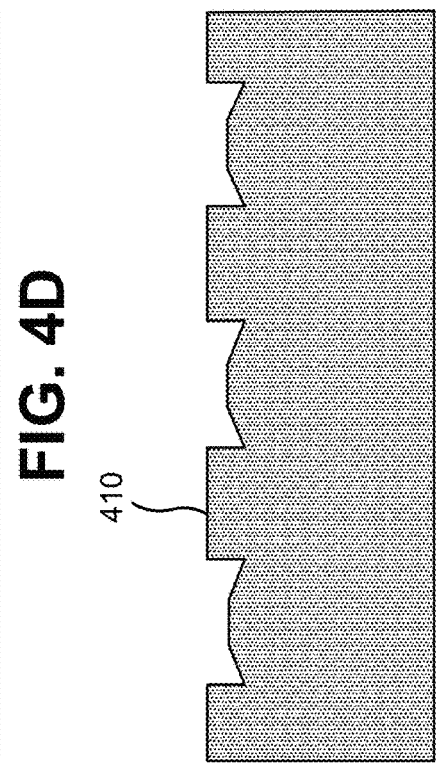
Figure 4B:
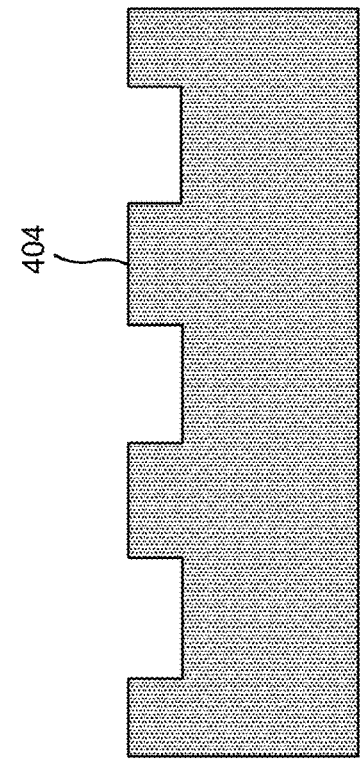

FIG. 4A illustrates a cross-sectional view of an example strain relief trench configuration 402. As shown in the example strain relief trench configuration 402, strain relief trenches may be half-circle shaped in a cross-sectional view of the strain relief trenches. FIG. 4B illustrates a cross-sectional view of an example strain relief trench configuration 404. As shown in the example strain relief trench configuration 404, strain relief trenches may be rectangle (or square) shaped in a cross-sectional view of the strain relief trenches.

Figure 4C:
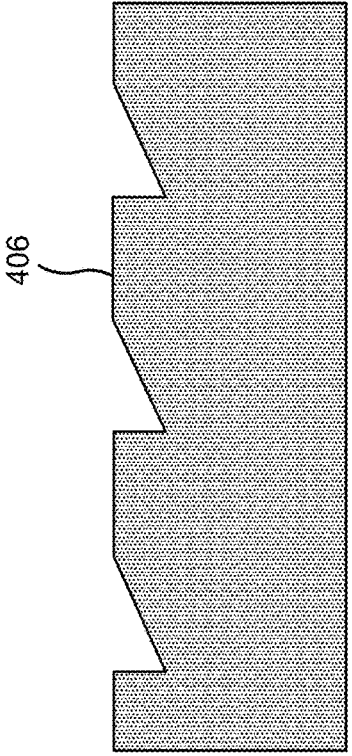

FIG. 4C illustrates a cross-sectional view of an example strain relief trench configuration 406. As shown in the example strain relief trench configuration 406, strain relief trenches may be triangle shaped in a cross-sectional view of the strain relief trenches. FIG. 4D illustrates a cross-sectional view of an example strain relief trench configuration 408. As shown in the example strain relief trench configuration 508, strain relief trenches may be complex and/or non-standard shaped in a cross-sectional view of the strain relief trenches. As an example, strain relief trenches may include a mirrored triangle shape, as shown in FIG. 4D. FIG. 4E illustrates a cross-sectional view of an example strain relief trench configuration 410. As shown in the example strain relief trench configuration 410, strain relief trenches may be complex and/or non-standard shaped in a cross-sectional view of the strain relief trenches. As an example, strain relief trenches may include a mirrored triangle shape with a flat center portion, as shown in FIG. 4E.

As indicated above, FIGS. 4A-4E are provided as one or more examples. Other examples may differ from what is described with regard to FIGS. 4A-4E. For example, any of the properties and/or parameters of strain relief trenches described above in connection with FIGS. 2A-2G (and/or the pattern of strain relief trenches), or a combination thereof, may be varied, configured, and/or adjusted for different trench configurations and/or for different epitaxial layer growth directions and patterns. Moreover, strain relief trenches formed in the same substrate may be formed to have different properties and/or parameters.

Figure 5:
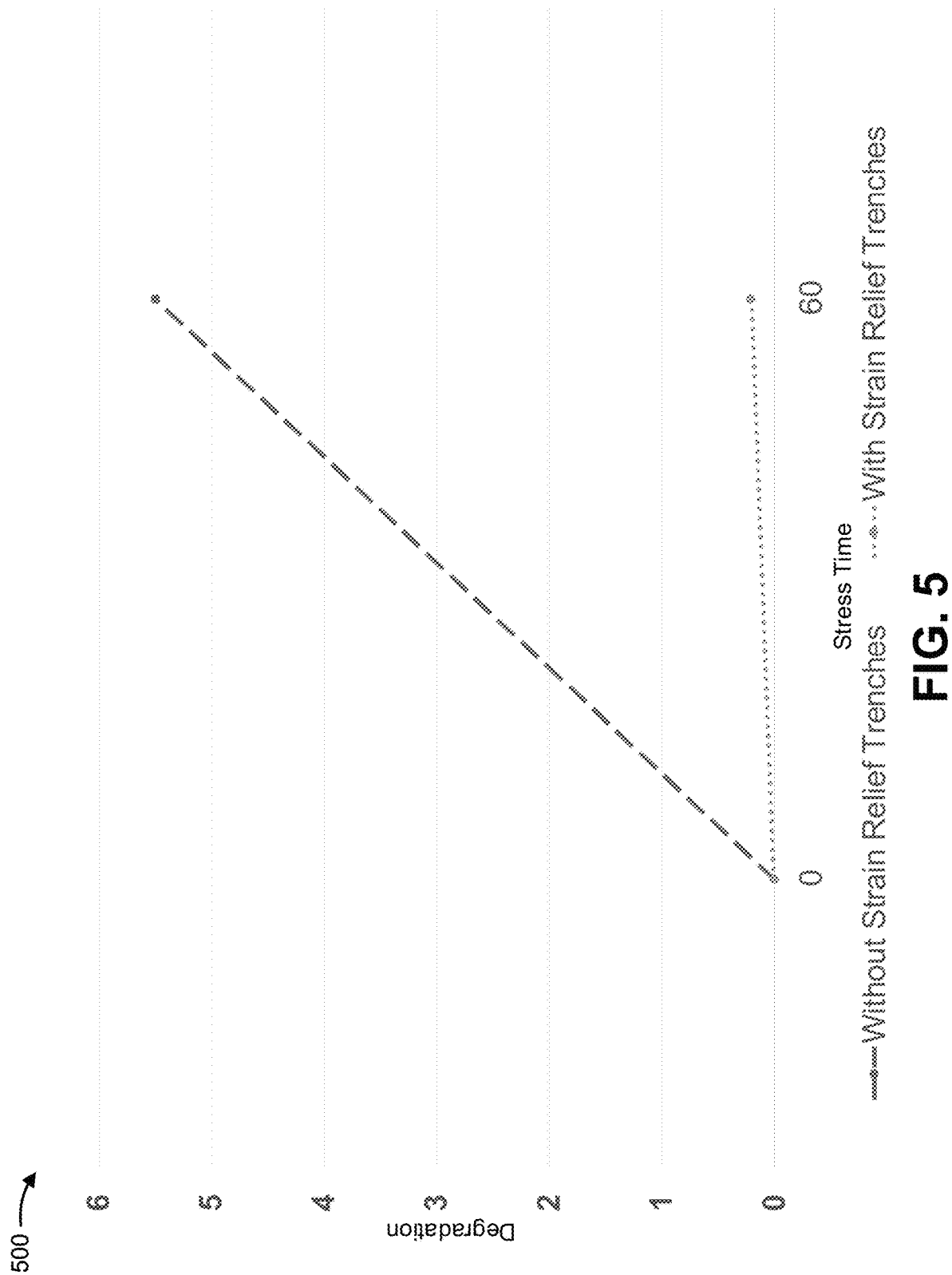
FIG. 5 is a diagram of an example of degradation data associated with one or more semiconductor structures described herein.

FIG. 5 is a diagram of an example of degradation data 500 associated with one or more semiconductor structures (e.g., epitaxial layer 214 of FIGS. 2A-2G, semiconductor structure 600 of FIG. 6 below, and/or the like) described herein. As shown in FIG. 5, the example degradation data 500 may include information identifying degradation experienced by semiconductor structures as a function of stress time (in hours). The degradation may be an on-resistance ($R_{ON}$) degradation of a GaN HEMT.

As further shown in FIG. 5, a semiconductor structure (e.g., of a GaN HEMT) that is formed without strain relief trenches 212 experiences relatively high $R_{ON}$ degradation (e.g., 5.8× $R_{ON}$ degradation) as stress time approaches 60 hours. A semiconductor structure (e.g., of a GaN HEMT) that is formed with strain relief trenches 212 experiences lower $R_{ON}$ degradation (e.g., 1.04× $R_{ON}$ degradation) compared with the semiconductor structure that is formed without strain relief trenches 212 as stress time approaches 60 hours.

As indicated above, FIG. 5 is provided as an example. Other examples may differ from what is described with regard to FIG. 5.

Figure 6:
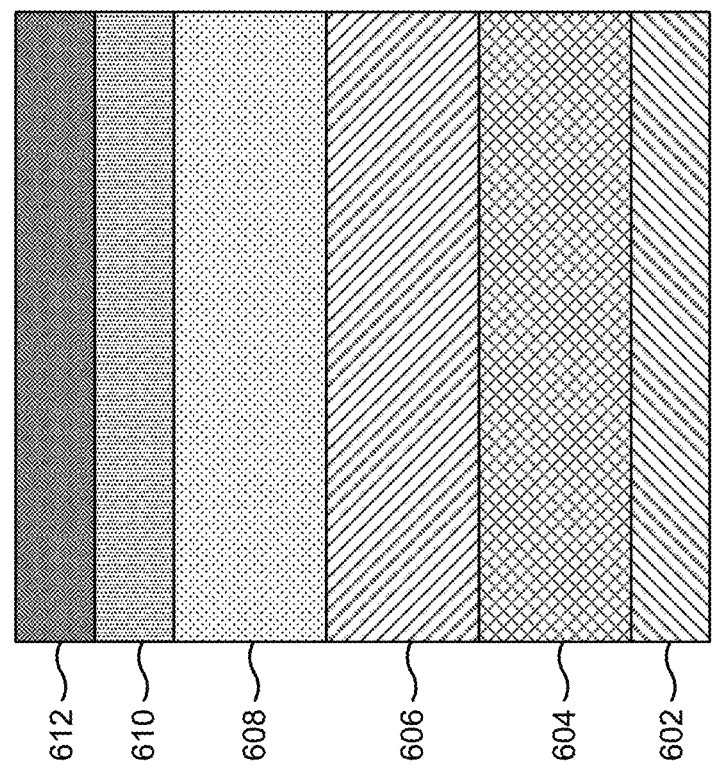
FIG. 6 is a diagram of an example semiconductor structure formed based on the example techniques described in connection with FIGS. 2A-2G.

FIG. 6 is an illustration of an example semiconductor structure 600 formed based on the example techniques described in connection with FIGS. 2A-2G. Example semiconductor structure 600 may be an example of an epitaxial layer that may be grown on a substrate having one or more strain relief trenches formed therein, such as the substrate 202 described above in connection with FIGS. 2A-2G.

As shown in FIG. 6, the example semiconductor structure 600 may include a plurality of layers. In some implementations, the semiconductor structure 600 may be a portion of a HEMT or another type of semiconductor device having one or more GaN layers. The plurality of layers may include a substrate 602, which may be a substrate of a wafer (e.g., wafer 200). In some implementations, the substrate 602 includes one or more strain relief trenches (e.g., strain relief trenches 212) formed therein. The substrate 602 may be an Si substrate, an SiC substrate, a sapphire substrate, or a substrate formed of another material.

As further shown in FIG. 6, a buffer layer 604 may be formed above, over, and/or on the substrate 602. The buffer layer 604 may include an aluminum nitride (AlN) layer, an aluminum gallium nitride (AlGaN) layer, a GaN layer, an Indium gallium nitride (InGaN), and/or the like. As further shown in FIG. 6, a spacer layer 606 (e.g., a GaN spacer layer) may be formed above, over, and/or on the buffer layer 604. As further shown in FIG. 6, a channel layer 608 (e.g., a GaN channel layer) may be formed over, above, and/or on the spacer layer 606. As further shown in FIG. 6, a barrier layer 610 may be formed over, above, and/or on the channel layer 608. The barrier layer 610 may include an AlGaN layer, an AlN layer, an ALGaN layer, a GaN layer, and/or the like. As further shown in FIG. 6, a p-doped GaN layer 612 may be formed over, above, and/or on the barrier layer 610.

The number and arrangement of layers shown in FIG. 6 is provided as an example. In practice, there may be additional layers, fewer layers, different layers, or differently arranged layers than those shown in FIG. 6.

Figure 7:
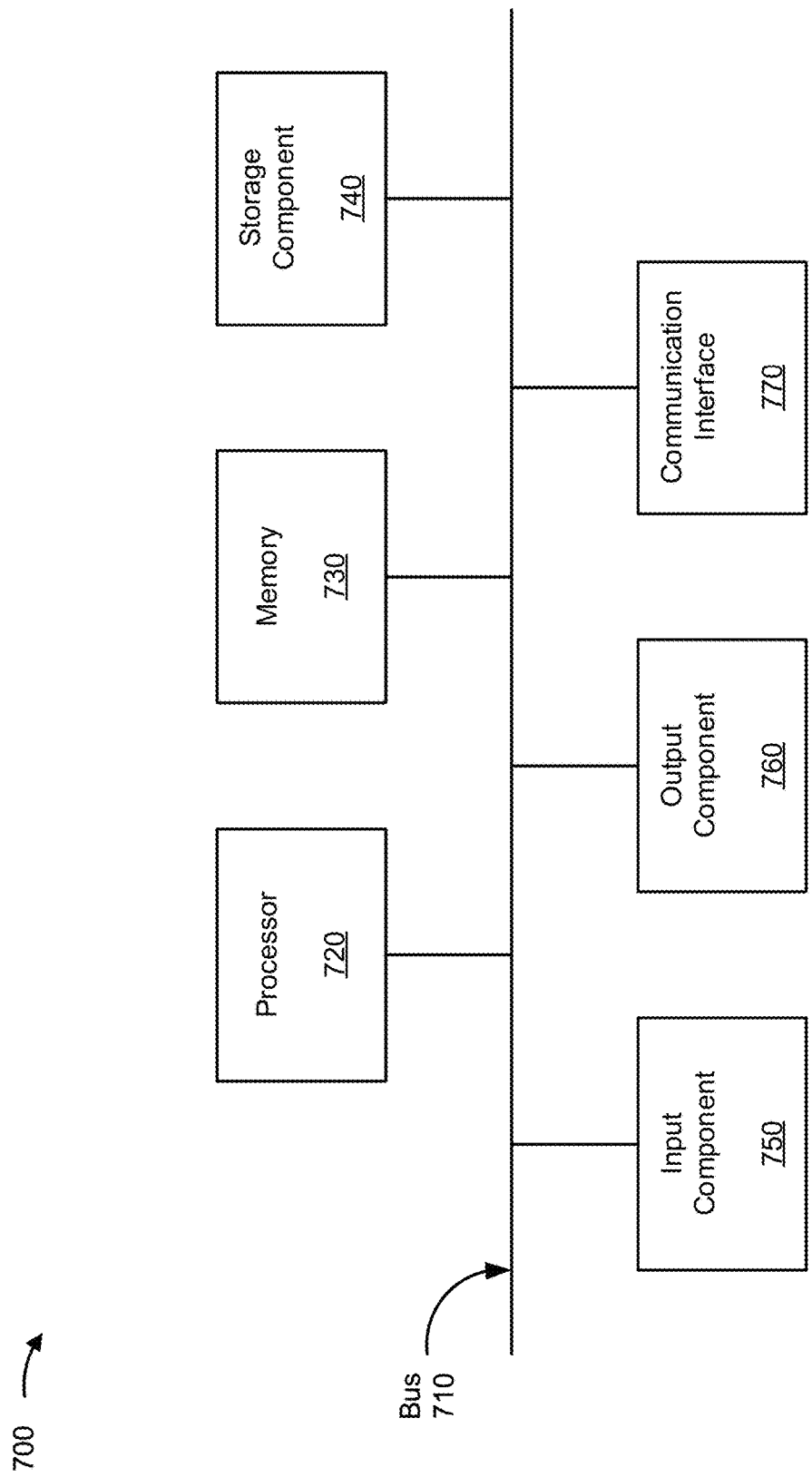
FIG. 7 is a diagram of example components of one or more devices of FIG. 1.

FIG. 7 is a diagram of example components of a device 700. In some implementations, one or more of the tools 102-110 and/or the wafer/die transport device 112 may include one or more devices 700 and/or one or more components of device 700. As shown in FIG. 7, device 700 may include a bus 710, a processor 720, a memory 730, a storage component 740, an input component 750, an output component 760, and a communication interface 770.

Bus 710 includes a component that permits communication among multiple components of device 700. Processor 720 is implemented in hardware, firmware, and/or a combination of hardware and software. Processor 720 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 720 includes one or more processors capable of being programmed to perform a function. Memory 730 includes a random access memory (RAM), a read only memory (ROM), and/or another type of dynamic or static storage device (e.g., a flash memory, a magnetic memory, and/or an optical memory) that stores information and/or instructions for use by processor 720.

Storage component 740 stores information and/or software related to the operation and use of device 700. For example, storage component 740 may include a hard disk (e.g., a magnetic disk, an optical disk, and/or a magneto-optic disk), a solid state drive (SSD), a compact disc (CD), a digital versatile disc (DVD), a floppy disk, a cartridge, a magnetic tape, and/or another type of non-transitory computer-readable medium, along with a corresponding drive.

Input component 750 includes a component that permits device 700 to receive information, such as via user input (e.g., a touch screen display, a keyboard, a keypad, a mouse, a button, a switch, and/or a microphone). Additionally, or alternatively, input component 750 may include a component for determining location (e.g., a global positioning system (GPS) component) and/or a sensor (e.g., an accelerometer, a gyroscope, an actuator, another type of positional or environmental sensor, and/or the like). Output component 760 includes a component that provides output information from device 700 (via, e.g., a display, a speaker, a haptic feedback component, an audio or visual indicator, and/or the like).

Communication interface 770 includes a transceiver-like component (e.g., a transceiver, a separate receiver, a separate transmitter, and/or the like) that enables device 700 to communicate with other devices, such as via a wired connection, a wireless connection, or a combination of wired and wireless connections. Communication interface 770 may permit device 700 to receive information from another device and/or provide information to another device. For example, communication interface 770 may include an Ethernet interface, an optical interface, a coaxial interface, an infrared interface, a radio frequency (RF) interface, a universal serial bus (USB) interface, a Wi-Fi interface, a cellular network interface, and/or the like.

Device 700 may perform one or more processes described herein. Device 700 may perform these processes based on processor 720 executing software instructions stored by a non-transitory computer-readable medium, such as memory 730 and/or storage component 740. As used herein, the term "computer-readable medium" refers to a non-transitory memory device. A memory device includes memory space within a single physical storage device or memory space spread across multiple physical storage devices.

Software instructions may be read into memory 730 and/or storage component 740 from another computer-readable medium or from another device via communication interface 770. When executed, software instructions stored in memory 730 and/or storage component 740 may cause processor 720 to perform one or more processes described herein. Additionally, or alternatively, hardware circuitry may be used in place of or in combination with software instructions to perform one or more processes described herein. Thus, implementations described herein are not limited to any specific combination of hardware circuitry and software.

The number and arrangement of components shown in FIG. 7 are provided as an example. In practice, device 700 may include additional components, fewer components, different components, or differently arranged components than those shown in FIG. 7. Additionally, or alternatively, a set of components (e.g., one or more components) of device 700 may perform one or more functions described as being performed by another set of components of device 700.

Figure 8:
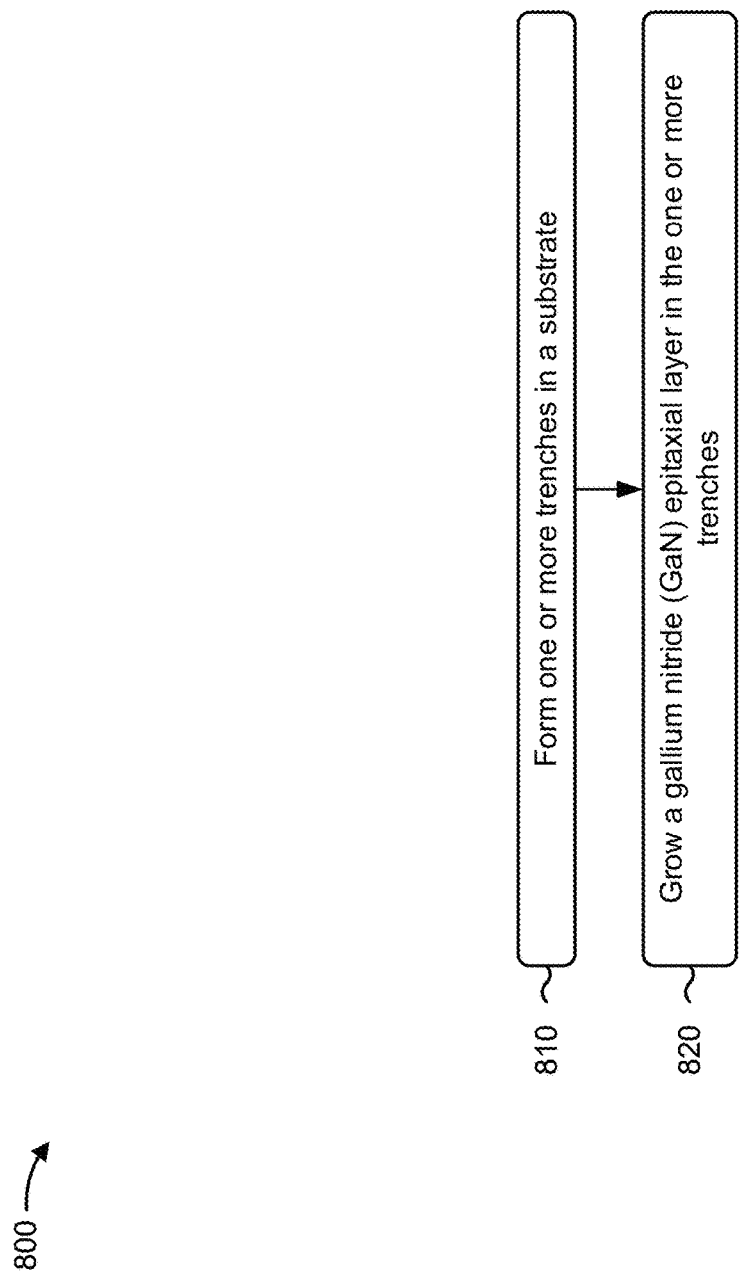

FIG. 8 is a flowchart of an example process 800 associated with epitaxial growth. In some implementations, one or more process blocks of FIG. 8 may be performed by one or more semiconductor processing tools (e.g., one or more of the semiconductor processing tools 102-110 of FIG. 1). In some implementations, one or more process blocks of FIG. 8 may be performed by one or more components of device 700, such as processor 720, memory 730, storage component 740, input component 750, output component 760, and/or communication interface 770.

As shown in FIG. 8, process 800 may include forming one or more trenches in a substrate (block 810). For example, the one or more semiconductor processing tools (e.g., the photoresist tool 102, the exposure tool 104, the developer tool 106, the etching tool 108, and/or the like) may form one or more trenches 212 in a substrate 202, as described above.

As further shown in FIG. 8, process 800 may include growing a GaN epitaxial layer in the one or more trenches (block 820). For example, the one or more semiconductor processing tools (e.g., the deposition tool 110 and/or the like) may grow a GaN epitaxial layer 214 in the one or more trenches 212, as described above.

Process 800 may include additional implementations, such as any single implementation or any combination of implementations described below and/or in connection with one or more other processes described elsewhere herein.

In a first implementation, the substrate comprises a silicon substrate. In a second implementation, alone or in combination with the first implementation, the one or more trenches are non-contiguous trenches (e.g., the trench 212*a*, the trench 212*b*, the trench 212*c*, and/or the like). In a third implementation, alone or in combination with one or more of the first and second implementations, the one or more trenches include a plurality of trenches, and wherein growing the GaN epitaxial layer comprises growing a respective portion of the GaN epitaxial layer (e.g., the portion 214*a* in the trench 212*a*, the portion 214*b* in the trench 212*b*, the portion 214*c* in the trench 212*c*, and/or the like) in each of the plurality of trenches.

In a fourth implementation, alone or in combination with one or more of the first through third implementations, at least two or more portions of the GaN epitaxial layer are non-contiguous portions. In a fifth implementation, alone or in combination with one or more of the first through fourth implementations, forming the one or more trenches includes forming the one or more trenches based on one or more parameters, wherein the one or more parameters are based on at least one of a diameter of the substrate, a thickness of the substrate, a thickness of the GaN epitaxial layer to be grown, or a material type of the substrate.

In a sixth implementation, alone or in combination with one or more of the first through fifth implementations, forming the one or more trenches includes forming the one or more trenches based on one or more parameters, and the one or more parameters include at least one of a depth of the one or more trenches, a width of the one or more trenches, a length of the one or more trenches, a spacing between the one or more trenches, a shape of the one or more trenches, a quantity of the one or more trenches, or a pattern of the one or more trenches. In a seventh implementation, alone or in combination with one or more of the first through sixth implementations, forming the one or more trenches includes forming a first subset of the one or more trenches based on a first set of parameters, and forming a second subset of the one or more trenches based on a second set of parameters, where at least a subset of the first set of parameters is different from a subset of the second set of parameters.

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

FIG. 9 is a flowchart of an example process 900 associated with epitaxial growth. In some implementations, one or more process blocks of FIG. 9 may be performed by one or more semiconductor processing tools (e.g., one or more of the semiconductor processing tools 102-110 of FIG. 1). In some implementations, one or more process blocks of FIG. 9 may be performed by one or more components of device 700, such as processor 720, memory 730, storage component 740, input component 750, output component 760, and/or communication interface 770.

As shown in FIG. 9, process 900 may include forming a photoresist layer over a substrate (block 910). For example, the one or more semiconductor processing tools (e.g., the photoresist tool 102) may form a photoresist layer 204 over a substrate 202, as described above.

As further shown in FIG. 9, process 900 may include exposing the photoresist layer to form a pattern in the photoresist layer (block 920). For example, the one or more semiconductor processing tools (e.g., the exposure tool 104) may expose the photoresist layer 204 to form a pattern 210 in the photoresist layer 204, as described above.

As further shown in FIG. 9, process 900 may include performing, using the pattern in the photoresist layer, a wet chemical etch of the substrate to form a plurality of trenches in the substrate (block 930). For example, the one or more semiconductor processing tools (e.g., the etching tool 108) may perform, using the pattern 210 in the photoresist layer 204, a wet chemical etch of the substrate 202 to form a plurality of trenches 212 in the substrate 202, as described above.

As further shown in FIG. 9, process 900 may include growing an epitaxial layer in the plurality of trenches (block 940). For example, the one or more semiconductor processing tools (e.g., the deposition tool 110) may grow an epitaxial layer 214 in the plurality of trenches 212, as described above.

Process 900 may include additional implementations, such as any single implementation or any combination of implementations described below and/or in connection with one or more other processes described elsewhere herein.

In a first implementation, growing the epitaxial layer comprises growing the epitaxial layer using an MBE process. In a second implementation, alone or in combination with the first implementation, growing the epitaxial layer comprises growing the epitaxial layer using an MOCVD process.

Although FIG. 9 shows example blocks of process 900, in some implementations, process 900 may include additional blocks, fewer blocks, different blocks, or differently arranged blocks than those depicted in FIG. 9. Additionally, or alternatively, two or more of the blocks of process 900 may be performed in parallel.

In this way, strain relief trenches may be formed in a substrate prior to growth of an epitaxial layer on the substrate. The trenches may reduce the stresses and strains on the epitaxial layer that occur during the epitaxial growth process due to differences in material properties (e.g., lattice mismatches, differences in IEC, and/or the like) between the epitaxial layer material and the substrate material. The stress and strain relief provided by the trenches may reduce or eliminate cracks and/or other types of defects in the epitaxial layer and the substrate, may reduce and/or eliminate bowing and warping of the substrate, may reduce breakage of the substrate, and/or the like. This may increase the center-to-edge quality of the epitaxial layer, may permit epitaxial layers to be grown on larger substrates, and/or the like.

As described in greater detail above, some implementations described herein provide a method. The method includes forming one or more trenches in a substrate. The method includes growing a GaN epitaxial layer in the one or more substrates.

As described in greater detail above, some implementations described herein provide a wafer. The wafer includes a substrate in which a plurality of trenches are formed. The wafer includes a plurality of epitaxial regions formed in the plurality of trenches.

As described in greater detail above, some implementations described herein provide a method. The method includes forming a photoresist layer over a substrate. The method includes exposing the photoresist layer to form a pattern in the photoresist layer. The method includes performing, using the pattern in the photoresist layer, a wet chemical etch of the substrate to form a plurality of trenches in the substrate. The method includes growing an epitaxial layer in the plurality of trenches.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a plurality of trenches in a plurality of first portions of a substrate; and
    growing a gallium nitride (GaN) epitaxial layer in the plurality of trenches,
        wherein the GaN epitaxial layer comprises non-contiguous portions based on the GaN epitaxial layer being grown in the plurality of trenches and not being grown in one or more second portions of the substrate,
        wherein wall angles of tapered walls for each portion of the non-contiguous portions are a same angle, and
        wherein a first portion of the GaN epitaxial layer grown in a first trench, of the plurality of trenches, has a different width-to-height aspect ratio than a second portion of the GaN epitaxial layer grown in a second trench of the plurality of trenches.

2. The method of claim 1, wherein the substrate comprises a silicon substrate.

3. The method of claim 1, wherein forming the plurality of trenches comprises:
    forming the plurality of trenches based on one or more parameters,
        wherein the one or more parameters are based on at least one of:
            a diameter of the substrate,
            a thickness of the substrate,
            a thickness of the GaN epitaxial layer to be grown, or
            a material type of the substrate.

4. The method of claim 1, wherein forming the plurality of trenches comprises:
    forming the plurality of trenches based on one or more parameters,
        wherein the one or more parameters comprise at least one of:
            a depth of a trench of the plurality of trenches,
            a width of a trench of the plurality of trenches,
            a length of a trench of the plurality of trenches,
            a spacing between two trenches of the plurality of trenches,
            a shape of a trench of the plurality of trenches,
            a quantity of the plurality of trenches, or
            a pattern of the plurality of trenches.

5. The method of claim 4, wherein forming the plurality of trenches comprises:
    forming a first subset of the plurality of trenches based on a first set of parameters; and
    forming a second subset of the plurality of trenches based on a second set of parameters,
        wherein at least a subset of the first set of parameters is different from a subset of the second set of parameters.

6. The method of claim 1, wherein forming the plurality of trenches comprises:
    forming the plurality of trenches to have tapered walls.

7. The method of claim 1, wherein a wall angle range, of the wall angles, includes 10 degrees to 15 degrees past 90 degrees.

8. The method of claim 1, wherein a top surface of the GaN epitaxial layer is higher than a top surface of the one or more second portions.

9. The method of claim 1, wherein forming the plurality of trenches comprises:
    forming the plurality of trenches in in a grid pattern.

10. The method of claim 1, wherein a height of the first portion of the GaN epitaxial layer is greater than a width of the first portion of the GaN epitaxial layer.

11. A method, comprising:
    forming a photoresist layer over a substrate;
    exposing the photoresist layer to form a pattern in the photoresist layer;
    performing, using the pattern in the photoresist layer, a wet chemical etch of the substrate to form a plurality of trenches in a plurality of first portions of the substrate; and
    growing an epitaxial layer in the plurality of trenches,
        wherein the epitaxial layer comprises non-contiguous portions based on the epitaxial layer being grown in the plurality of trenches and not being grown in one or more second portions of the substrate,
        wherein wall angles of tapered walls for each portion of the non-contiguous portions are a same angle, and
        wherein a first portion of the epitaxial layer grown in a first trench, of the plurality of trenches, has a different width-to-height aspect ratio than a second portion of the epitaxial layer grown in a second trench of the plurality of trenches.

12. The method of claim 11, wherein growing the epitaxial layer comprises:
    growing the epitaxial layer using a molecular beam epitaxy (MBE) process.

13. The method of claim 11, wherein growing the epitaxial layer comprises:
    growing the epitaxial layer using a metal organic chemical vapor deposition (MOCVD) process.

14. A wafer, comprising:
a substrate comprising a plurality of first portions in which a plurality of trenches are formed; and
a plurality of epitaxial regions grown in the plurality of trenches,
  wherein the plurality of epitaxial regions are non-contiguous portions of a gallium nitride (GaN) epitaxial layer based on the GaN epitaxial layer being grown in the plurality of trenches and not being grown in one or more second portions of the substrate,
  wherein a top surface of the GaN epitaxial layer is higher than a top surface of the one or more second portions,
  wherein wall angles of tapered walls for each portion of the non-contiguous portions are a same angle, and
  wherein a first portion of the GaN epitaxial layer grown in a first trench, of the plurality of trenches, has a different width-to-height aspect ratio than a second portion of the GaN epitaxial layer grown in a second trench of the plurality of trenches.

15. The wafer of claim 14, further comprising:
a buffer layer between the plurality of epitaxial regions and the plurality of trenches;
a spacer layer between the plurality of epitaxial regions and the buffer layer;
a channel layer between the plurality of epitaxial regions and the spacer layer; and
a barrier layer between the plurality of epitaxial regions and the channel layer.

16. The wafer of claim 14, wherein a depth of a first subset of the plurality of trenches and a depth of a second subset of the plurality of trenches are different depths.

17. The wafer of claim 14, wherein a width of a first subset of the plurality of trenches and a width of a second subset of the plurality of trenches are different widths.

18. The wafer of claim 14, wherein a spacing between a first subset of the plurality of trenches and a spacing between a second subset of the plurality of trenches are different spacings.

19. The wafer of claim 9, wherein the substrate comprises:
a silicon substrate,
a silicon carbide substrate, or
an aluminum oxide substrate.

20. The wafer of claim 14, wherein the plurality of trenches are formed in a grid pattern.

* * * * *